(12) United States Patent
Then et al.

(10) Patent No.: US 10,243,069 B2
(45) Date of Patent: Mar. 26, 2019

(54) GALLIUM NITRIDE TRANSISTOR HAVING A SOURCE/DRAIN STRUCTURE INCLUDING A SINGLE-CRYSTAL PORTION ABUTTING A 2D ELECTRON GAS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US); Seung Hoon Sung, Portland, OR (US); Sanaz Gardner, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/511,139

(22) PCT Filed: Oct. 30, 2014

(86) PCT No.: PCT/US2014/063140
§ 371 (c)(1),
(2) Date: Mar. 14, 2017

(87) PCT Pub. No.: WO2016/068935
PCT Pub. Date: May 6, 2016

(65) Prior Publication Data
US 2017/0278959 A1    Sep. 28, 2017

(51) Int. Cl.
*H01L 29/15* (2006.01)
*H01L 29/778* (2006.01)
(Continued)

(52) U.S. Cl.
CPC ........ *H01L 29/7783* (2013.01); *H01L 21/283* (2013.01); *H01L 21/3085* (2013.01);
(Continued)

(58) Field of Classification Search
CPC ..................... H01L 29/7783; H01L 21/283
(Continued)

(56) References Cited

U.S. PATENT DOCUMENTS

| 5,847,419 A | 12/1998 | Imai et al. |
| 6,121,153 A | 9/2000 | Kikkawa |

(Continued)

FOREIGN PATENT DOCUMENTS

| JP | 62-040778 A | 2/1987 |
| JP | 6240778 | 2/1987 |

(Continued)

OTHER PUBLICATIONS

International Preliminary Report on Patentability and Written Opinion received for PCT Patent Application No. PCT/US2014/063140, dated May 11, 2017, 9 pages.
(Continued)

*Primary Examiner* — Caleb Henry
(74) *Attorney, Agent, or Firm* — Green, Howard & Mughal LLP (57) ABSTRACT

The present description relates to a gallium nitride transistor which includes at least one source/drain structure having low contact resistance between a 2D electron gas of the gallium nitride transistor and the source/drain structure. The low contact resistance may be a result of at least a portion of the source/drain structure being a single-crystal structure abutting the 2D electron gas. In one embodiment, the single-crystal structure is grown with a portion of a charge inducing layer of the gallium nitride transistor acting as a nucleation site.

18 Claims, 7 Drawing Sheets

(51) Int. Cl.

| | | |
|---|---|---|
| *H01L 29/66* | (2006.01) | |
| *H01L 29/08* | (2006.01) | |
| *H01L 21/283* | (2006.01) | |
| *H01L 21/308* | (2006.01) | |
| *H01L 29/45* | (2006.01) | |
| *H01L 29/423* | (2006.01) | |
| *H01L 29/04* | (2006.01) | |
| *H01L 29/20* | (2006.01) | |

(52) U.S. Cl.
CPC .......... *H01L 29/04* (2013.01); *H01L 29/0847* (2013.01); *H01L 29/452* (2013.01); *H01L 29/66462* (2013.01); *H01L 29/7786* (2013.01); *H01L 29/045* (2013.01); *H01L 29/2003* (2013.01); *H01L 29/4236* (2013.01)

(58) Field of Classification Search
USPC .......................................................... 257/76
See application file for complete search history.

(56) References Cited

U.S. PATENT DOCUMENTS

| | | | |
|---|---|---|---|
| 6,225,196 | B1 | 5/2001 | Yokoyama |
| 2007/0045670 | A1 | 3/2007 | Kuraguchi |
| 2009/0267078 | A1 | 10/2009 | Mishra et al. |
| 2010/0219452 | A1 | 9/2010 | Brierley |
| 2010/0270559 | A1 | 10/2010 | Ota |
| 2011/0278945 | A1 | 11/2011 | Wheatley, III et al. |
| 2012/0248500 | A1 | 10/2012 | Kajitana |
| 2013/0043485 | A1 | 2/2013 | Ueno |
| 2013/0271208 | A1 | 10/2013 | Then et al. |
| 2013/0307513 | A1* | 11/2013 | Then ................ H01L 29/66469 323/311 |
| 2013/0313561 | A1 | 11/2013 | Suh |
| 2013/0334538 | A1 | 12/2013 | Saunier |
| 2014/0091310 | A1 | 4/2014 | Jeon et al. |
| 2014/0094223 | A1 | 4/2014 | Dasgupta et al. |
| 2014/0264380 | A1 | 9/2014 | Kub et al. |
| 2015/0014820 | A1 | 2/2015 | Renaud |

FOREIGN PATENT DOCUMENTS

| | | |
|---|---|---|
| JP | 2008305816 | 12/2008 |
| JP | 2011049521 | 3/2011 |
| JP | 2011159795 | 8/2011 |
| KR | 10-2012-0048244 A | 5/2012 |
| KR | 20120048244 | 5/2012 |
| KR | 10-2013-0046249 A | 5/2013 |
| KR | 20130046249 | 5/2013 |

OTHER PUBLICATIONS

International Search Report and Written Opinion received for PCT Patent Application No. PCT/US2014/063140, dated Jul. 13, 2015, 12 pages.
International Search Report and Written Opinion received for PCT Patent Application No. PCT/US2014/066115, dated Jul. 31, 2015, 12 pages.
International Search Report and Written Opinion received for PCT Patent Application No. PCT/US2014/071163, dated Sep. 17, 2015, 13 pages.
Extended European Search Report from European Patent Application No. 14905255.7 dated May 16, 2018, 9 pgs.
Guo, Jia et al., "MBE-Regrown Ohmics in InAlN HEMTs With a Regrowth Interface Resistance of 0.05Ω * mm", IEEE Electron Device Letters, vol. 33, No. 4, Apr. 2012, 3 pgs.
Non-Final Office Action from Japanese Patent Application No. 2017-514622 dated Jun. 26, 2018, 5 pgs.
Extended European Search Report for European Patent Application No. 14906448.7, dated Jun. 8, 2018.
Extended European Search Report from European Patent Application No. 14908596.1 dated Aug. 13, 2018, 8 pgs.
International Preliminary Report on Patentability from PCT/US2014/063140 dated May 11, 2017, 9 pgs.
International Preliminary Report on Patentability from PCT/US2014/066115 dated Jun. 1, 2017, 9 pgs.
International Preliminary Report on Patentability from PCT/US2014/071163 dated Jun. 29, 2017, 3 pgs.
Notice of Allowance from U.S. Appl. No. 15/526,735 dated Apr. 30, 2018, 9 pgs.
Non-Final Office Action dated Aug. 30, 2018 for U.S. Appl. No. 15/519,277.
Hahn, H et al., "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014.6872396 ISBN: 978-1-47-995405-6.
Takei, Y et al., "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.

* cited by examiner

GALLIUM NITRIDE TRANSISTOR HAVING A SOURCE/DRAIN STRUCTURE INCLUDING A SINGLE-CRYSTAL PORTION ABUTTING A 2D ELECTRON GAS

RELATED APPLICATION

The present application is a national stage entry of PCT Patent Application No. PCT/US2014/063140, filed on Oct. 30, 2014, entitled "SOURCE/DRAIN REGROWTH FOR LOW CONTACT RESISTANCE TO 2D ELECTRON GAS IN GALLIUM NITRIDE TRANSISTORS", which is hereby incorporated herein by reference in its entirety and for all purposes.

TECHNICAL FIELD

Embodiments of the present description generally relate to the field of microelectronic devices, and, more particularly, to forming gallium nitride transistors having a low contact resistance source and drain structures.

BACKGROUND

The microelectronics industry is continually striving to produce ever faster and smaller microelectronic packages for use in various electronic products, including, but not limited to, computer server products and portable products, such as laptop/netbook computers, electronic tablets, smart phones, digital cameras, and the like. One route to achieve these goals is the fabrication of System-on-Chip (SoC) devices, wherein all of the components of an electronic system are fabricated on a single chip. In such SoC devices, power management integrated circuits (PMIC) and radio frequency integrated circuits (RFIC) are critical functional blocks, and are as important as logic and memory integrated circuits in determining the power efficiency and the form factor of such SoC devices. Therefore, there is an ongoing effort to scaled down and/or improve the efficiency of PMICs and RFICs, as well as logic and memory integrated circuits, for SoC devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description related to gallium nitride transistors which include a source/drain structure that has low contact resistance between a 2D electron gas of the gallium nitride transistors and the source/drain structure. The low contact resistance is a result of at least a portion of the source/drain structure being a single-crystal structure abutting the 2D electron gas. In one embodiment, the single-crystal structure is grown with a portion of a charge inducing layer of the gallium nitride transistor acting as a nucleation site.

Figure 1:
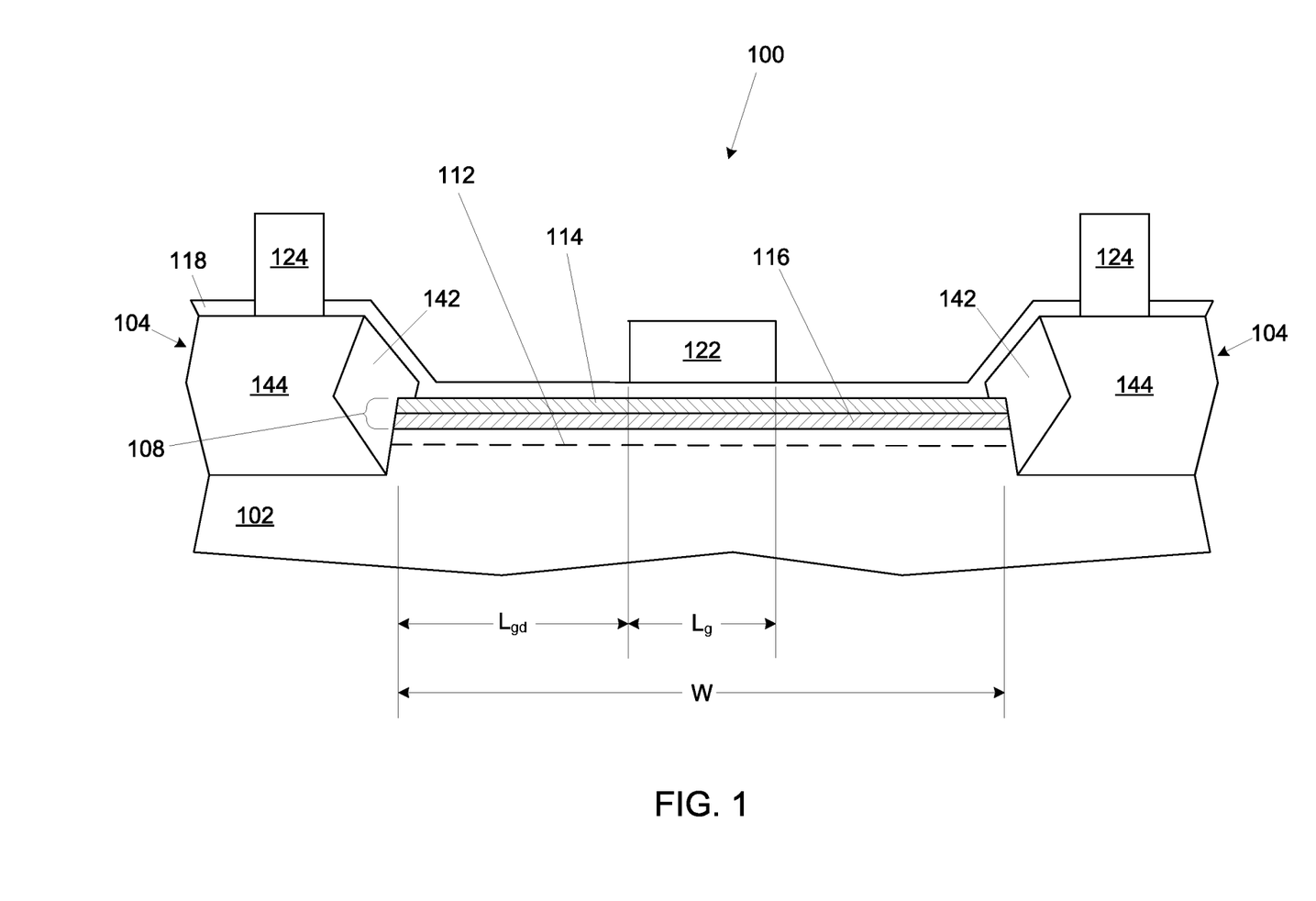
FIG. 1 is a side cross-section view of a gallium nitride transistor, according to an embodiment of the present description.
Figure 2:
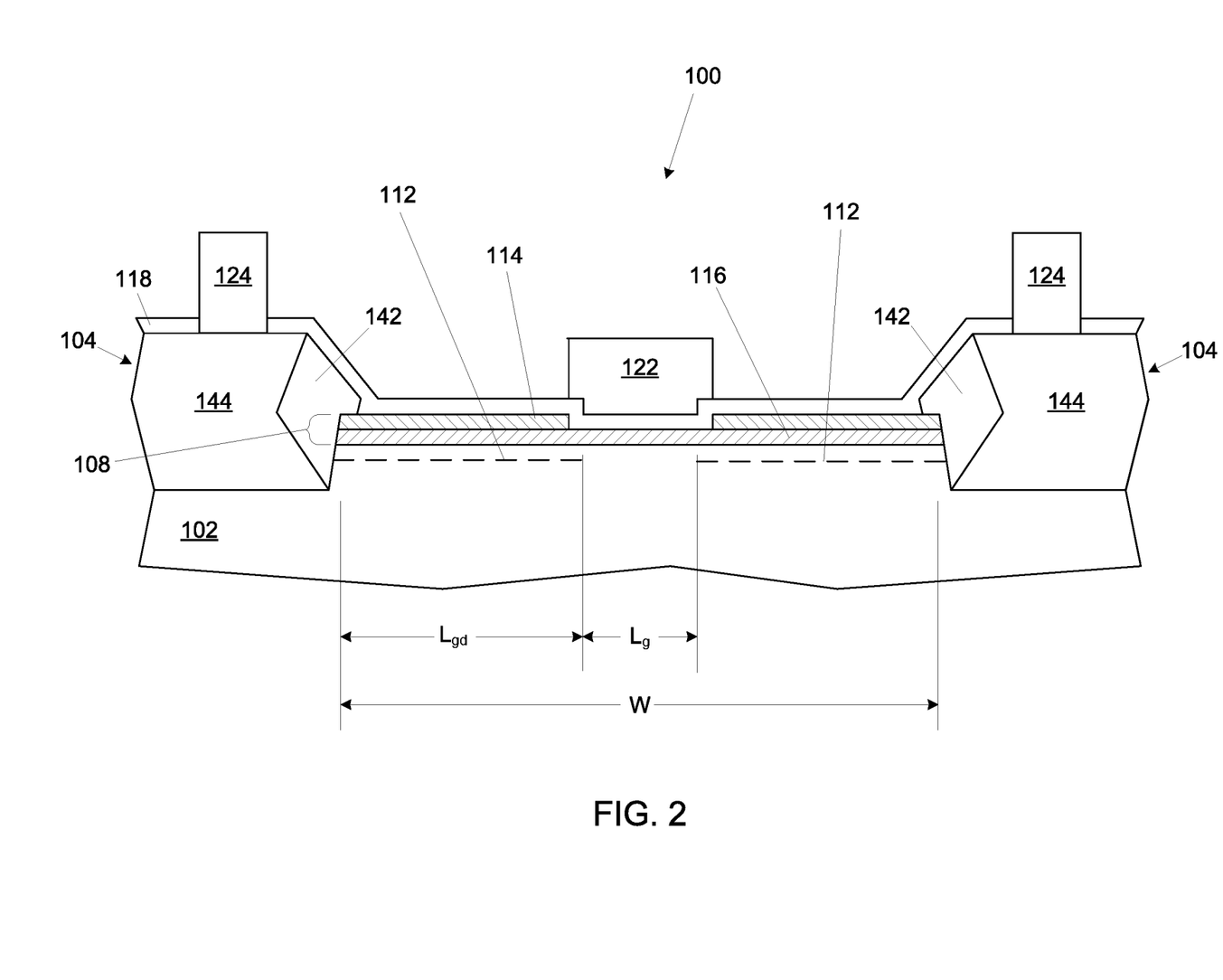
FIG. 2 is a side cross-section view of a gallium nitride transistor, according to another embodiment of the present description.

FIGS. 1 and 2 illustrates a gallium nitride transistor 100 according to embodiments of the present description. The gallium nitride transistor 100 may comprise a gallium nitride layer 102 having opposing source/drain structures 104 (one being a source structure and the other being a drain structure) formed therein. A charge inducing layer 108 may be formed on the gallium nitride layer 102 extending between the opposing source/drain structures 104, which forms a 2D electron gas (illustrated with dashed line 112) within the gallium nitride layer 102. In one embodiment, the charge inducing layer 108 may comprise a polarization layer 114 formed on a crystal transition layer 116, wherein the crystal transition layer 116 abuts the gallium nitride layer 102. The polarization layer 114 may have ternary crystal structure which forms the 2D electron gas 112, but may inhibit electron mobility within the binary crystal structure of the gallium nitride layer 102. Therefore, the crystal transition layer 116 may be a binary crystal structure which acts a transition between the polarization layer 114 and the gallium nitride layer 102. It is understood that although the charge inducing layer 108 is illustrated as having two layers (i.e. the polarization layer 114 and the crystal transition layer 116), it may be fabricated as a single layer or have more than two layers.

As further shown in FIGS. 1 and 2, a dielectric layer 118 may be formed over the polarization layer 114 and a gate electrode 122 may be formed on the dielectric layer 118 such that the dielectric layer 118 electrically isolated the gate electrode 122 from the polarization layer 114. Furthermore, source/drain contacts 124 may electrically connect the source/drain structures 104 with external components (not shown), as will be understood to those skilled in the art.

Gallium nitride has a relatively wide bandgap (e.g. about 3.4 eV), when compared to the bandgap of silicon (about 1.1 eV). Therefore, the gallium nitride transistor 100 may withstand large electric fields, such as applied voltages, drain voltage, and the like, before suffering breakdown, when compared to a silicon based transistor of similar dimensions. Furthermore, as will be understood to those skilled in the art, the gallium nitride transistor 100 employs the 2D electron gas 112 as its electron transport channel for the operation thereof. The 2D electron gas 112 is formed at the abrupt hetero-interface formed by the deposition of the charge inducing layer 108 on the gallium nitride layer 102. Very high charge densities up to about 2E13 per $cm^2$ can be formed by such a mechanism, without the use of impurity dopants, which allows for high electron mobility, e.g. greater than about 1000 $cm^2/V_s$. As will be understood to those skilled in the art, in order take full advantage of the properties of gallium nitride, the gallium nitride transistor 100 may be heterogeneously integrated onto a silicon substrate (not shown) to place the gallium nitride transistor 100 in close proximity to silicon CMOS (Complimentary Metal-Oxide Semiconductor) transistors (not shown) in order to minimize interconnect losses, and achieve smaller footprint, as well as other scaling advantages known in the art.

For use in power management and radio frequency amplification, the gallium nitride transistor 100 may require large widths W (distance between opposing source/drain structures 104) of greater than about 1 mm to deliver sufficiently large currents (e.g. greater than about 1 A) and sufficiently large radio frequency power (e.g. greater than about 1 W) in radio frequency applications. Furthermore, the gallium nitride transistor 100 may have a submicron scale employing channel length $L_g$ of less than about 150 nm, and gate-to-drain distance $L_{gd}$ of between about 50 nm and 500 nm to ensure minimum use of space (assigning the drain to be the source/drain structure 104 on the left hand side of FIGS. 1 and 2). Moreover, the gallium nitride transistor 100, when used for power management and/or radio frequency amplification, may require low on-state resistance (Ron) to ensure low power ($I^2R$) dissipation for high efficiency of voltage conversion and radio frequency power amplification. On a submicron scale in the gallium nitride transistor 100, the on-state resistance may be largely dominated by the contact resistance between the source/drain structures 104 and the 2D electron gas 112. Therefore, embodiments of the present description relate to a low contact resistance, single-crystal portion 142 of the source/drain structures 104 abutting the 2D electron gas 112.

As illustrated in FIG. 1, in one embodiment of the present description, the polarization layer 114 may extend the entire transistor width W and thus, the 2D electron gas 112 extends through the gate length $L_g$. However, in another embodiment of the present description as shown in FIG. 2, a portion of the polarization layer may be removed or not formed proximate the gate electrode 122, and thus, the 2D electron gas 112 may not extend through the gate length $L_g$.

Figure 3:
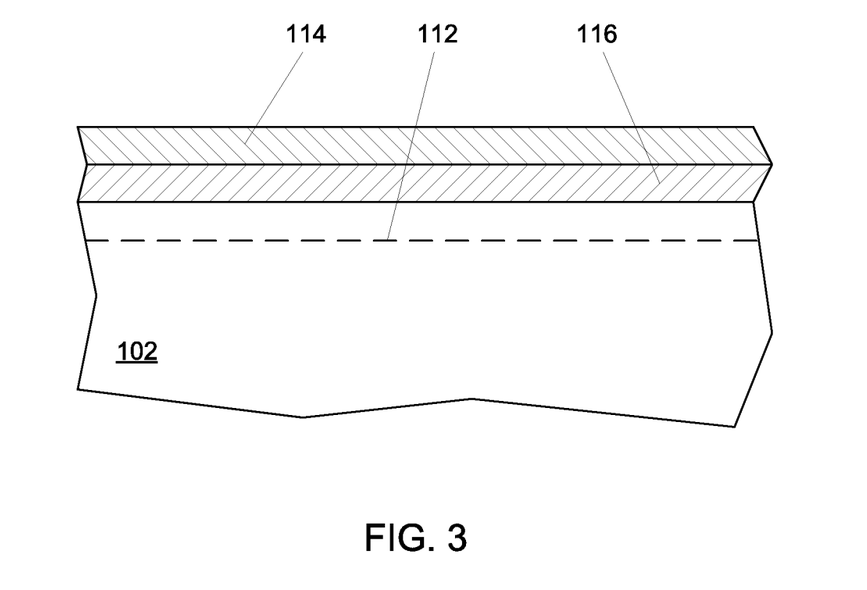
FIGS. 3-6 are side cross-section views of the fabrication of a source/drain structure for a gallium nitride transistor, according to an embodiment of the present description.

FIGS. 3-6 illustrate a process for forming a source/drain structure 104 (e.g. either forming a source structure or a drain structure) according to an embodiment of the present description. As shown in FIG. 3, the charge inducing layer 108 may be formed on the gallium nitride layer 102. As previously discussed, in one embodiment, the charge inducing layer 108 may comprise the polarization layer 114 formed on the crystal transition layer 116, which abuts the gallium nitride layer 102. In one embodiment, the polarization layer 114 may include, but is not limited to aluminum gallium nitride, aluminum indium nitride, indium gallium nitride, and aluminum nitride. In another embodiment, the crystal transition layer 116 may include but is not limited to indium nitride and aluminum nitride.

Figure 4:
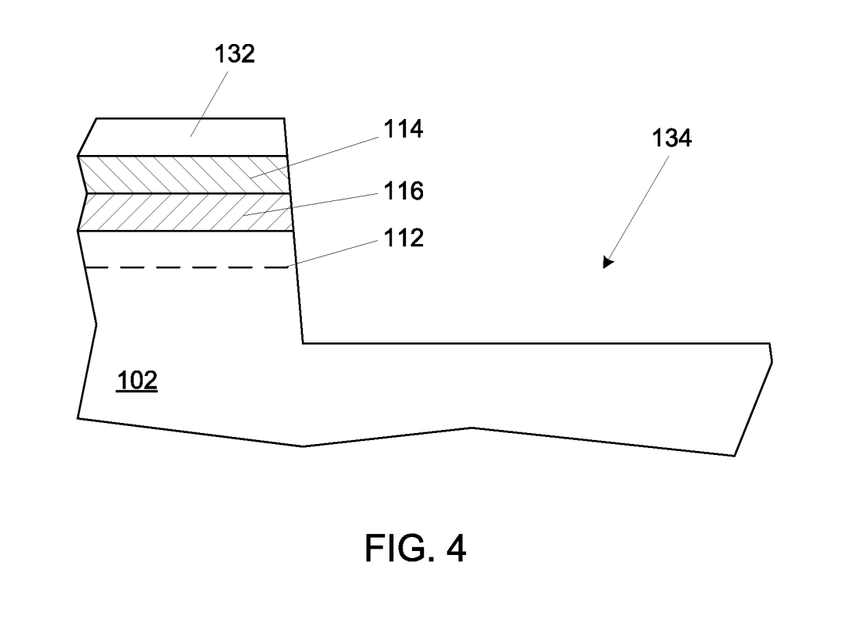

As shown in FIG. 4, a hardmask 132, such as silicon nitride, silicon oxide, and the like, may be patterned by any known technique, such as photolithography, and a recess 134 may be formed to extend through the charge inducing layer 108 (e.g. the polarization layer 114 and the crystal transition layer 116) and into the gallium nitride layer 102, by any known technique, such as etching. In one embodiment, the recess 134 may be formed with a plasma etch in a chlorine based chemistry.

At this point in known processes, a source/drain structure comprising N+ indium gallium nitride, N+ gallium nitride, N+ indium nitride, and any graded combination thereof would be formed by poly-crystalline regrowth from the gallium nitride layer 102. However, such regrowth can result in a highly defective source/drain structure, which contacts the 2D electron gas 112. Such a highly defective source/drain structure may result in a contact resistance of about 470 ohm-μm or higher between the source/drain structure and the 2D electron gas 112 for each source/drain structure. Thus, the on-state resistance of the gallium nitride transistor 100 (see FIG. 1) would be limited to no less than about 940 ohm-μm.

Figure 5:
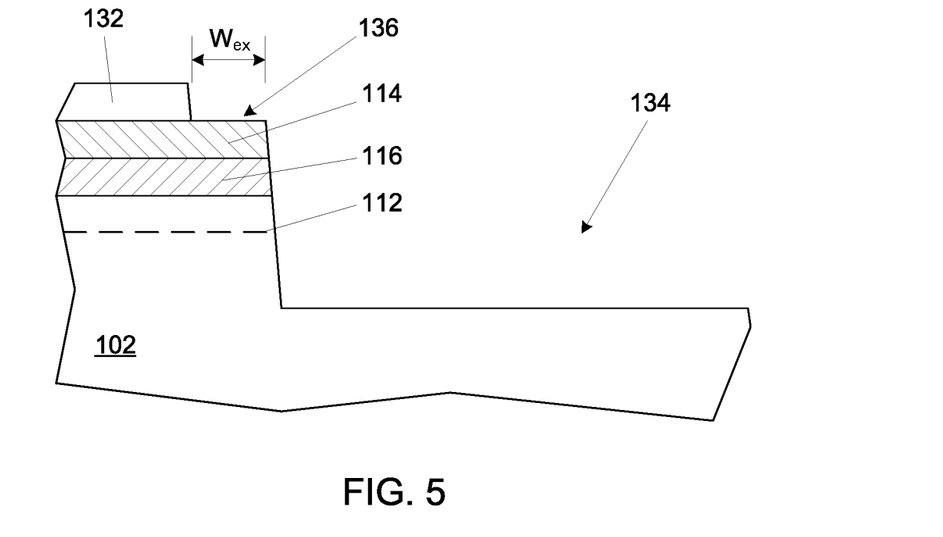

As shown in FIG. 5, in an embodiment of the present description, a portion of the hard mask 132 may be removed proximate the recess 134 to expose a portion of the charge inducing layer 108, in specific a portion 136 of the polarization layer 114. In one embodiment of the present description, the width $W_{ex}$ of the exposed polarization layer portion 136 may be less the about 15 nm. In another embodiment of the present invention, the exposure of the polarization layer portion 136 may be achieved using a wet etch of dilute hydrofluoric acid.

Figure 6:
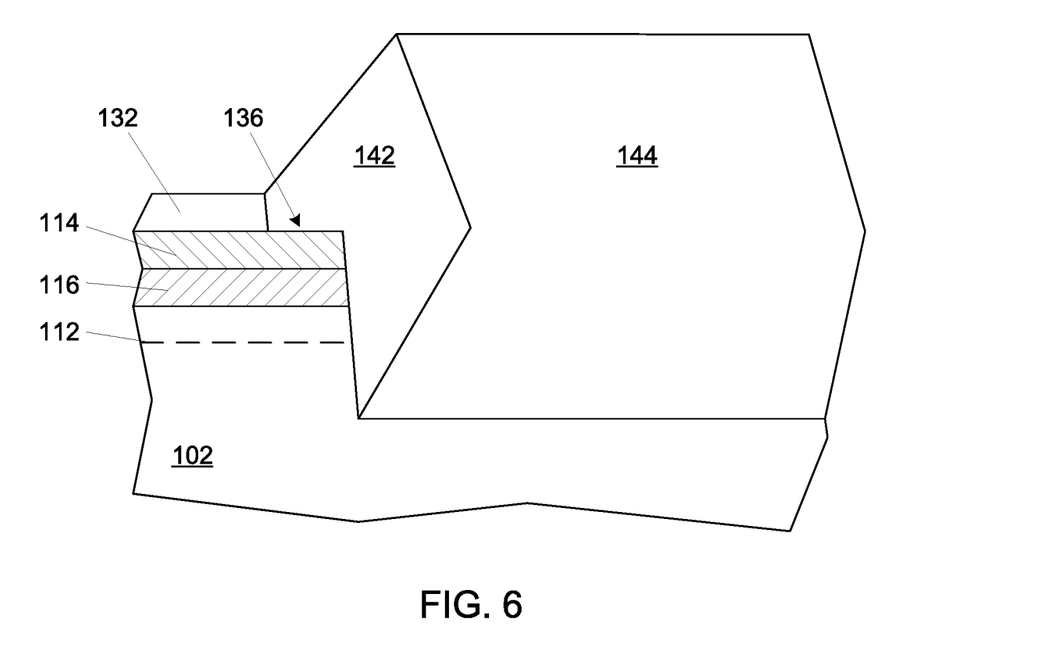

As shown in FIG. 6, the exposed polarization layer portion 136 may serve as a nucleation site during the regrowth process, such that the single-crystal portion 142 of the source/drain structure 104 which abuts the 2D electron gas 112 is grown from the exposed polarization layer portion 136, while a poly-crystal portion 144 of the source/drain structure 104 may grow from the gallium nitride layer 102.

The single-crystal portion 142 of the source/drain structure 104 may have a contact resistance of about 130 ohm-μm or lower between each source/drain structure 104 and the 2D electron gas 112. Thus, the on-state resistance of the gallium nitride transistor 100 (see FIG. 1) would be about 260 ohm-μm. In one embodiment, the single-crystal portion 142 may comprise indium gallium nitride. In specific, the single-crystal portion 142 may be an epitaxially regrown N+ doped (2E20/cm$^3$ silicon) In$_{0.1}$Ga$_{0.9}$N on the exposed polarization layer portion 136 comprising Al$_{0.83}$In$_{0.17}$N. In another embodiment, the single-crystal portion 142 may comprise gallium nitride. In specific, the single-crystal portion 142 may be N+ doped (silicon) gallium nitride.

In one embodiment, the regrowth process may comprise epitaxial crystal growth techniques, such as metal organic chemical vapor deposition (MOCVD) or molecular beam epitaxy (MBE).

Figure 7:
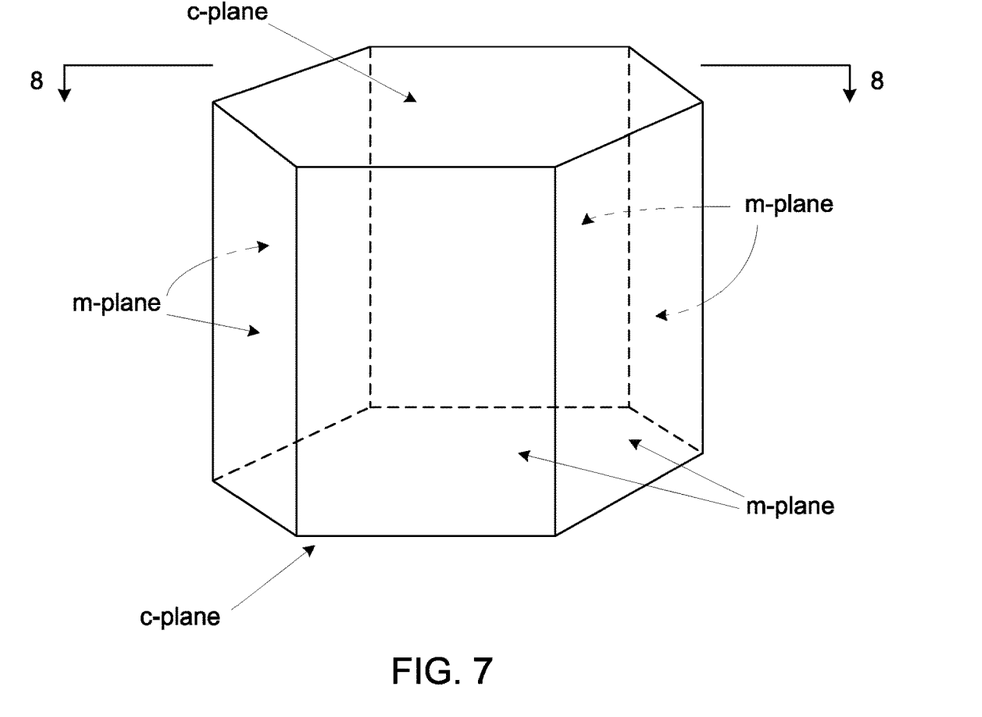
FIGS. 7 and 8 illustrate oblique and top plane views of a gallium nitride crystal.
Figure 8:
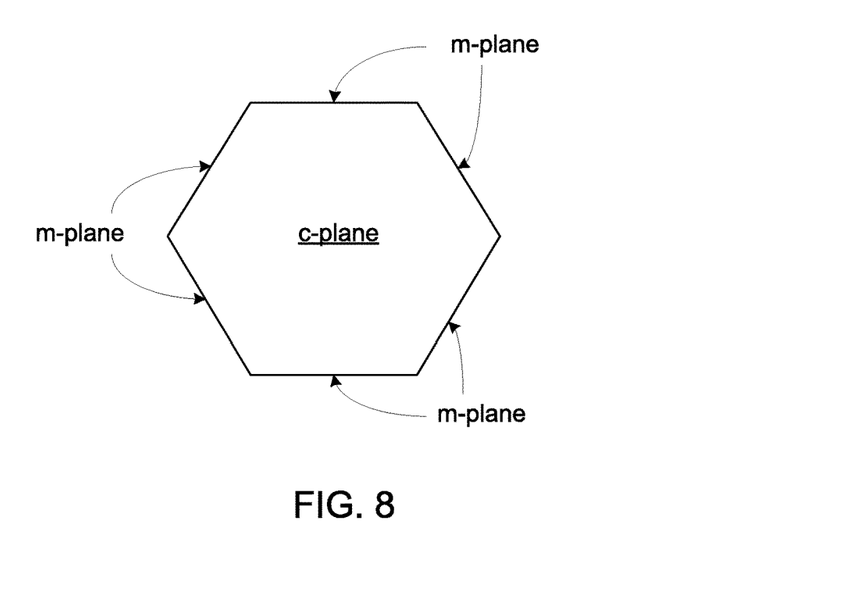

It is further noted that certain orientations of the channel or current flow results in about 23% lower (e.g. better) contact resistance ($R_{cc}$). These orientations may correspond to the N+ indium gallium nitride crystals of the single-crystal portion 142 being aligned substantially parallel to the m-planes of the hexagonal wurtzite crystal structure of the gallium nitride in the gallium nitride layer 102, as will be understood to those skilled in the art. The m-planes of a hexagonal wurtzite crystal structure 148 relative to c-planes thereof are illustrated in FIGS. 7 and 8 (top plane view along line 8-8 of FIG. 7).

It is still further noted that the ability to fabricate a single-crystal portion 142 for a source/drain structure 104 out of the exposed polarization layer portion 136 may enable the fabrication of gallium nitride transistors 100 (see FIGS. 1 and 2) at very tight pitches, i.e., ultra scaled source/drain contacts 124 (see FIGS. 1 and 2) of less than 100 nm, as will be understood to those skilled in the art.

Referring back to FIGS. 1 and 2, the dielectric layer 118 may be formed from any well-known gate dielectric material, including but not limited to silicon dioxide (SiO$_2$), silicon oxynitride (SiO$_x$N$_y$), silicon nitride (Si$_3$N$_4$), and high-k dielectric materials such as hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, lead scandium tantalum oxide, and lead zinc niobate. The dielectric layer 118 can be formed by well-known techniques, such as chemical vapor deposition ("CVD"), physical vapor deposition ("PVD"), atomic layer deposition ("ALD"). The gate electrode 122 can be formed of any suitable gate electrode material. In an embodiment of the present disclosure, the gate electrode 122 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 122 can be formed by well-known techniques, such as by blanket depositing a gate electrode material and then patterning the gate electrode material with well-known photolithography and etching techniques, as will be understood to those skilled in the art.

Figure 9:
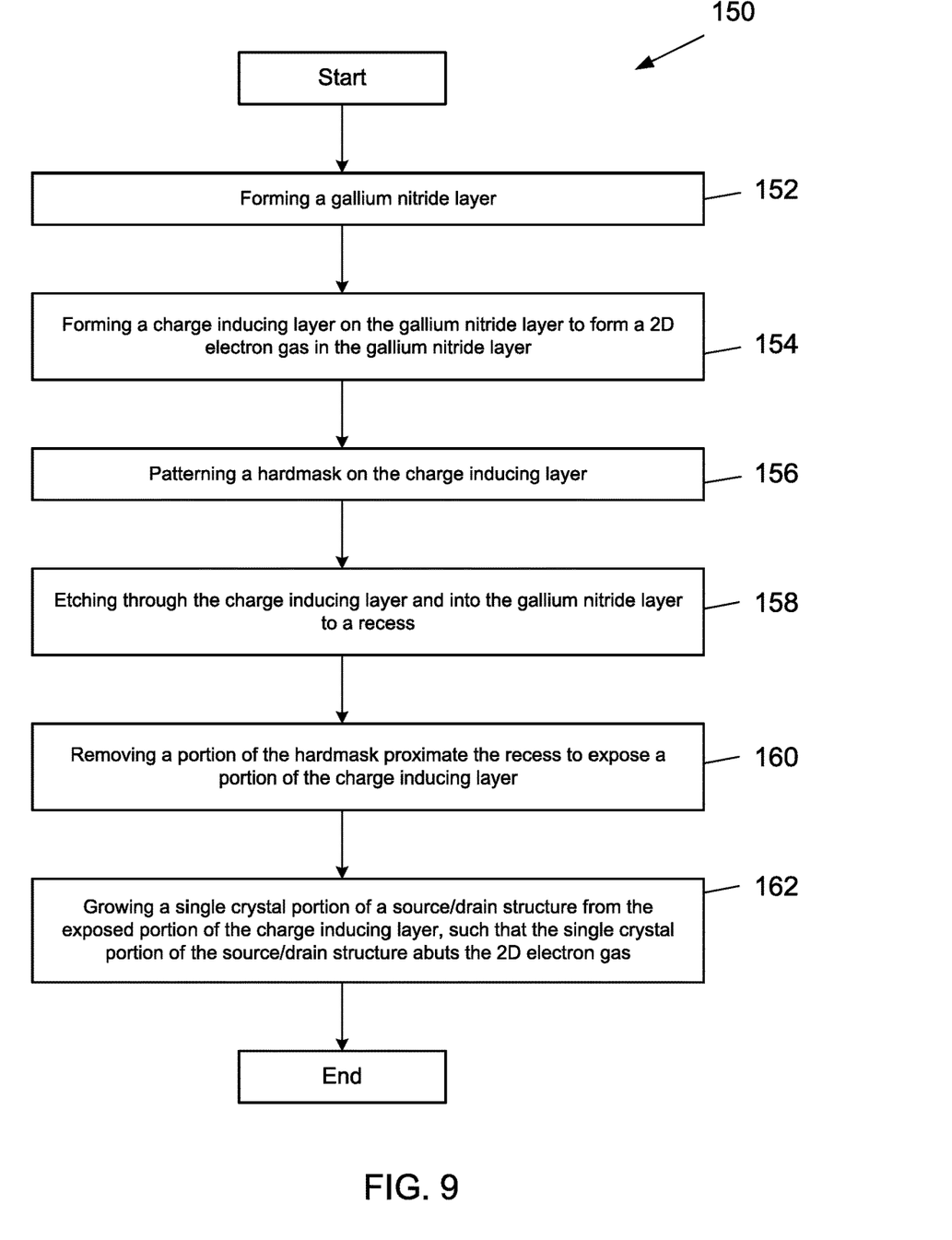
FIG. 9 is a flow chart of a process of fabricating a microelectronic structure, according to an embodiment of the present description.

FIG. 9 is a flow chart of a process 150 of fabricating a microelectronic device according to an embodiment of the present description. As set forth in block 152, a gallium nitride layer may be formed. A charge inducing layer may be formed on the gallium nitride layer to form a 2D electron gas within the gallium nitride layer, as set forth in block 154. As set forth in block 156, a hardmask may be patterned on the charge inducing layer. A recess may be formed by etching through the charge inducing layer and into the gallium nitride layer, as set in block 158. As set forth in block 160, a portion of the hardmask proximate the recess may be removed to expose a portion of the charge inducing layer. A single-crystal portion of a source/drain structure may be grown from the exposed portion of the charge inducing layer, such that the single-crystal portion of the source/drain structure abuts the 2D electron gas, as set forth in block 162.

Figure 10:
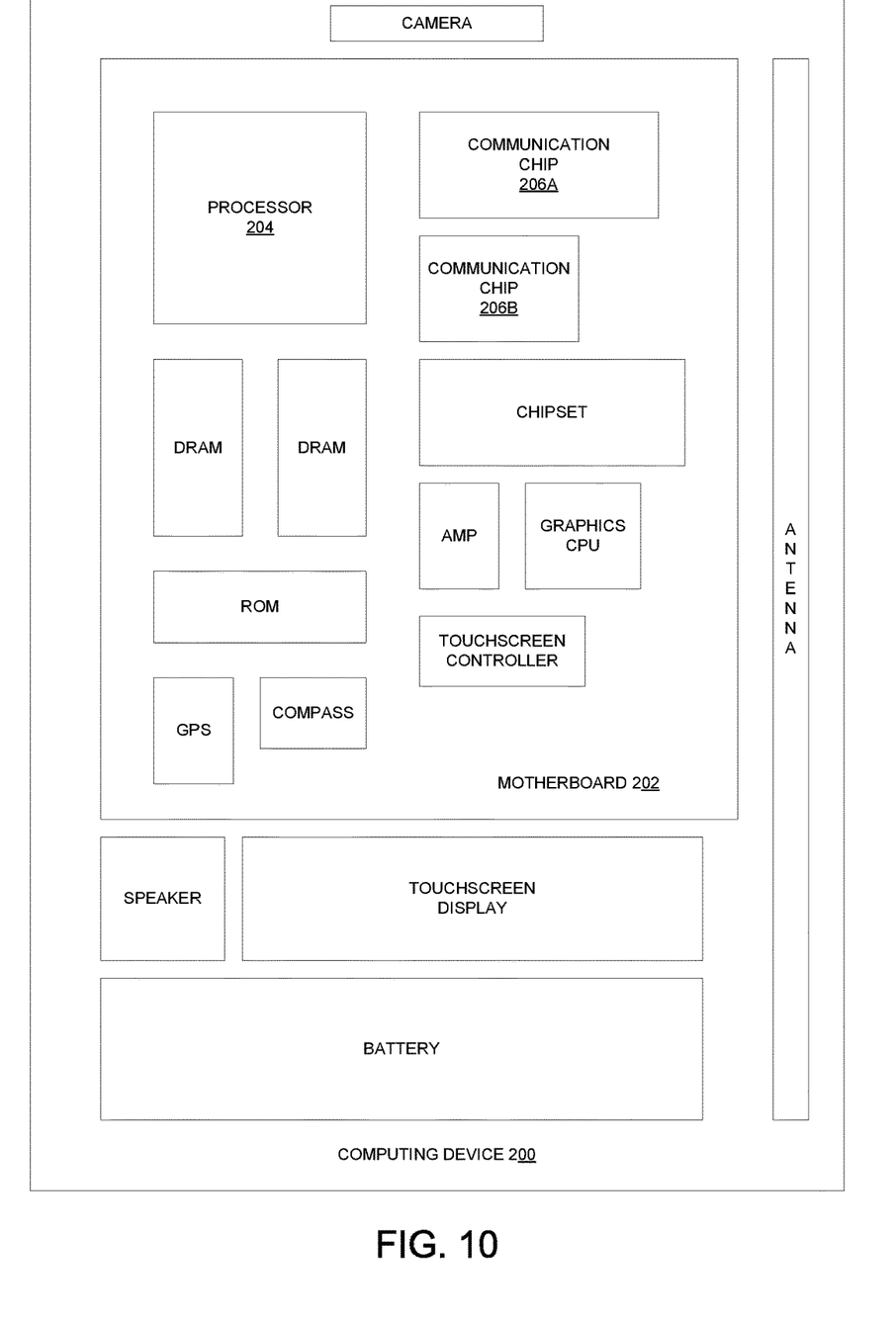
FIG. 10 illustrates a computing device in accordance with one implementation of the present description.

FIG. 10 illustrates a computing device 200 in accordance with one implementation of the present description. The computing device 200 houses a board 202. The board 202 may include a number of components, including but not limited to a processor 204 and at least one communication chip 206A, 206B. The processor 204 is physically and electrically coupled to the board 202. In some implementations the at least one communication chip 206A, 206B is also physically and electrically coupled to the board 202. In further implementations, the communication chip 206A, 206B is part of the processor 204.

Depending on its applications, the computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206A, 206B enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206A, 206B. For instance, a first communication chip 206A may be dedicated to shorter range wireless communications such as Wi-Fi and Bluetooth and a second communication chip 206B may be dedicated to longer range wireless communications such as GPS, EDGE, GPRS, CDMA, WiMAX, LTE, Ev-DO, and others.

The processor 204 of the computing device 200 may include microelectronic transistors as described above. The term "processor" may refer to any device or portion of a device that processes electronic data from registers and/or memory to transform that electronic data into other electronic data that may be stored in registers and/or memory. Furthermore, the communication chip 206A, 206B may include microelectronic transistors fabricated as described above.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

It is understood that the subject matter of the present description is not necessarily limited to specific applications illustrated in FIGS. 1-10. The subject matter may be applied to other microelectronic device and assembly applications, as well as any other appropriate transistor applications, as will be understood to those skilled in the art.

The following examples pertain to further embodiments, wherein Example 1 is a microelectronic structure comprising a gallium nitride layer, a charge inducing layer on the gallium nitride layer, a 2D electron gas within the gallium nitride layer, and a source/drain structure including a single-crystal portion abutting the 2D electron gas.

In Example 2, the subject matter of Example 1 can optionally include the single-crystal portion of the source/drain structure comprising indium gallium nitride.

In Example 3, the subject matter of Example 2 can optionally include the indium gallium nitride single-crystal portion of the source/drain structure comprising N+ doped indium gallium nitride.

In Example 4, the subject matter of Example 2 can optionally include a crystal orientation of the indium gallium nitride single-crystal portion of the source/drain structure aligned substantially parallel to m-planes of a hexagonal wurtzite crystal structure of the gallium nitride layer.

In Example 5, the subject matter of Example 1 can optionally include the single-crystal portion of the source/drain structure comprising gallium nitride.

In Example 6, the subject matter of Example 5 can optionally include the indium gallium nitride single-crystal portion of the source/drain structure comprising N+ doped gallium nitride.

In Example 7, the subject matter of Example 5 can optionally include a crystal orientation of the gallium nitride single-crystal portion of the source/drain structure aligned substantially parallel to m-planes of a hexagonal wurtzite crystal structure of the gallium nitride layer.

In Example 8, the subject matter of any of Examples 1 to 7 can optionally include the charge inducing layer comprising a polarization layer formed on a crystal transition layer, wherein the crystal transition layer abuts the gallium nitride layer.

In Example 9, the subject matter of Example 8 can optionally include the polarization layer comprising aluminum indium nitride.

In Example 10, the subject matter of Example 8 can optionally include the crystal transition layer comprising indium nitride.

In Example 11, the subject matter of Example 8 can optionally include the crystal transition layer comprising indium nitride.

In Example 12, the subject matter of any of Examples 1 to 7 can optionally include a poly crystal portion of the source/drain structure abutting the single-crystal portion of the source/drain structure and the gallium nitride layer.

The following examples pertain to further embodiments, wherein Example 13 is a method of fabricating a microelectronic structure, comprising forming a gallium nitride layer, forming a charge inducing layer on the gallium nitride layer to form a 2D electron gas within the gallium nitride layer, patterning a hardmask on the charge inducing layer, etching through the charge inducing layer and into the gallium nitride layer to form a recess, removing a portion of the hardmask proximate the recess to expose a portion of the charge inducing layer, and growing a single-crystal portion of a source/drain structure from the exposed portion of the charge inducing layer, such that the single-crystal portion of the source/drain structure abuts the 2D electron gas.

In Example 14, the subject matter of Example 13 can optionally include growing the single-crystal portion of the source/drain structure comprising growing an indium gallium nitride single-crystal portion of the source/drain structure.

In Example 15, the subject matter of Example 14 can optionally include growing the indium gallium nitride single-crystal portion of the source/drain structure comprising growing N+ doped indium gallium nitride.

In Example 16, the subject matter of Example 14 can optionally include growing the indium gallium nitride single-crystal portion of the source/drain structure comprising growing a crystal orientation of indium gallium nitride single-crystal portion of the source/drain structure aligned substantially parallel to m-planes of a hexagonal wurtzite crystal structure of the gallium nitride layer.

In Example 17, the subject matter of Example 13 can optionally include growing the single-crystal portion of the source/drain structure comprising growing a gallium nitride single-crystal portion of the source/drain structure.

In Example 18, the subject matter of Example 17 can optionally include growing the indium gallium nitride single-crystal portion of the source/drain structure comprising growing N+ doped indium gallium nitride.

In Example 19, the subject matter of Example 17 can optionally include growing the indium gallium nitride single-crystal portion of the source/drain structure comprising growing a crystal orientation of indium gallium nitride single-crystal portion of the source/drain structure aligned substantially parallel to m-planes of a hexagonal wurtzite crystal structure of the gallium nitride layer.

In Example 20, the subject matter of any of Examples 13 to 19 can optionally include forming the charge inducing layer comprising forming a crystal transition layer on the gallium nitride layer and forming a polarization layer on a crystal transition layer.

In Example 21, the subject matter of Example 20 can optionally include forming the polarization layer comprising forming an aluminum indium nitride polarization layer.

In Example 22, the subject matter of Example 20 can optionally include forming the crystal transition layer comprising forming an indium nitride crystal transition layer.

In Example 23, the subject matter of Example 20 can optionally include forming the crystal transition layer comprising forming an aluminum nitride crystal transition layer.

In Example 23, the subject matter of any of Examples 13 to 19 can optionally include forming a poly crystal portion of the source/drain structure abutting the single-crystal portion of the source/drain structure and the gallium nitride layer.

The following examples pertain to further embodiments, wherein Example 25 is an electronic system, comprising a board and a microelectronic device attached to the board, wherein the microelectronic device includes at least one gallium nitride transistor comprising a gallium nitride layer, a charge inducing layer on the gallium nitride layer, a 2D electron gas within the gallium nitride layer, and a source/drain structure including a single-crystal portion abutting the 2D electron gas.

In Example 26, the subject matter of any of Example 25 can optionally include the single-crystal portion of the source/drain structure comprising indium gallium nitride.

In Example 27, the subject matter of any of Example 26 can optionally include the indium gallium nitride single-crystal portion of the source/drain structure comprising N+ doped indium gallium nitride.

In Example 28, the subject matter of any of Example 26 can optionally include a crystal orientation of indium gallium nitride single-crystal portion of the source/drain structure aligned substantially parallel to m-planes of a hexagonal wurtzite crystal structure of the gallium nitride layer.

In Example 29, the subject matter of any of Example 25 can optionally include the single-crystal portion of the source/drain structure comprising indium gallium nitride.

In Example 30, the subject matter of any of Example 29 can optionally include the indium gallium nitride single-crystal portion of the source/drain structure comprising N+ doped indium gallium nitride.

In Example 31, the subject matter of any of Example 29 can optionally include a crystal orientation of indium gallium nitride single-crystal portion of the source/drain structure aligned substantially parallel to m-planes of a hexagonal wurtzite crystal structure of the gallium nitride layer.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure comprising:
   a gallium nitride layer;
   a charge inducing layer on the gallium nitride layer;
   a 2D electron gas within the gallium nitride layer; and
   a source/drain structure including a single-crystal portion abutting the 2D electron gas;
   wherein the single-crystal portion is indium gallium nitride having a crystal orientation aligned substantially parallel to m-planes of a hexagonal wurtzite crystal structure of the gallium nitride layer.

2. The microelectronic structure of claim 1, wherein the single-crystal portion of the source/drain structure is N+ doped.

3. A microelectronic structure comprising:
   a gallium nitride layer;
   a charge inducing layer on the gallium nitride layer;
   a 2D electron gas within the gallium nitride layer; and
   a source/drain structure including a single-crystal portion abutting the 2D electron gas;
   wherein the single-crystal portion is gallium nitride having a crystal orientation aligned substantially parallel to m-planes of a hexagonal wurtzite crystal structure of the gallium nitride layer.

4. The microelectronic structure of claim 3, wherein the single-crystal portion of the source/drain structure is N+ doped.

5. A microelectronic structure comprising:
   a gallium nitride layer;
   a charge inducing layer on the gallium nitride layer;
   a 2D electron gas within the gallium nitride layer; and
   a source/drain structure including a single-crystal portion abutting the 2D electron gas;
   wherein the charge inducing layer comprises a polarization layer formed on a crystal transition layer, wherein the crystal transition layer abuts the gallium nitride layer.

6. The microelectronic structure of claim 5, wherein the polarization layer comprises aluminum indium nitride.

7. The microelectronic structure of claim 5, wherein the crystal transition layer comprises indium nitride.

8. The microelectronic structure of claim 5, wherein the crystal transition layer comprises aluminum nitride.

9. A microelectronic structure comprising:
   a gallium nitride layer;
   a charge inducing layer on the gallium nitride layer;
   a 2D electron gas within the gallium nitride layer;
   a source/drain structure including a single-crystal portion abutting the 2D electron gas; and
   a poly crystal portion of the source/drain structure abutting the single-crystal portion of the source/drain structure and the gallium nitride layer.

10. An electronic system, comprising:
    a board; and
    a microelectronic device attached to the board, wherein the microelectronic device includes at least one gallium nitride transistor comprising a gallium nitride layer, a charge inducing layer on the gallium nitride layer, a 2D electron gas within the gallium nitride layer, and a source/drain structure including a single-crystal portion abutting the 2D electron gas, wherein the single-crystal portion is indium gallium nitride having a crystal orientation aligned substantially parallel to m-planes of a hexagonal wurtzite crystal structure of the gallium nitride layer.

11. The electronic system of claim 10, wherein the single-crystal portion of the source/drain structure is N+ doped.

12. An electronic system comprising:
    a board; and
    a microelectronic device attached to the board, wherein the microelectronic device includes at least one gallium nitride transistor comprising a gallium nitride layer, a charge inducing layer on the gallium nitride layer, a 2D electron gas within the gallium nitride layer, and a source/drain structure including a single-crystal portion abutting the 2D electron gas, wherein the single-crystal portion is gallium nitride having a crystal orientation aligned substantially parallel to m-planes of a hexagonal wurtzite crystal structure of the gallium nitride layer.

13. The electronic system of claim 12, wherein the single-crystal portion of the source/drain structure is N+ doped.

14. An electronic system comprising:
    a board; and
    a microelectronic device attached to the board, wherein the microelectronic device includes at least one gallium nitride transistor comprising a gallium nitride layer, a charge inducing layer on the gallium nitride layer, a 2D electron gas within the gallium nitride layer, and a source/drain structure including a single-crystal portion abutting the 2D electron gas, wherein the charge inducing layer comprises a polarization layer formed on a crystal transition layer, wherein the crystal transition layer abuts the gallium nitride layer.

15. The electronic system of claim 14, wherein the polarization layer comprises aluminum indium nitride.

16. The electronic system of claim 14, wherein the crystal transition layer comprises indium nitride.

17. The electronic system of claim 14, wherein the crystal transition layer comprises aluminum nitride.

18. An electronic system comprising:
a board; and
a microelectronic device attached to the board, wherein the microelectronic device includes at least one gallium nitride transistor comprising a gallium nitride layer, a charge inducing layer on the gallium nitride layer, a 2D electron gas within the gallium nitride layer, a source/drain structure including a single-crystal portion abutting the 2D electron gas, and a poly-crystal portion of the source/drain structure abutting the single-crystal portion of the source/drain structure and the gallium nitride layer.

* * * * *